United States Patent [19]
Eichelberger

[11] Patent Number: 6,159,767
[45] Date of Patent: Dec. 12, 2000

[54] SINGLE CHIP MODULES, REPAIRABLE MULTICHIP MODULES, AND METHODS OF FABRICATION THEREOF

[75] Inventor: Charles William Eichelberger, Schenectady, N.Y.

[73] Assignee: EPIC Technologies, Inc., Woburn, Mass.

[21] Appl. No.: 09/106,631

[22] Filed: Jun. 29, 1998

Related U.S. Application Data

[62] Division of application No. 08/650,628, May 20, 1996.

[51] Int. Cl.$^7$ .............................. H01L 21/44; H01L 21/00
[52] U.S. Cl. ......................... 438/107; 438/106; 438/109; 438/4; 438/928
[58] Field of Search .................................... 438/106, 107, 438/597, 618, 977, 109, 108, 4, 928, 455, 459; 257/723, 773, 787

[56] References Cited

U.S. PATENT DOCUMENTS

| | | | |
|---|---|---|---|
| 4,630,096 | 12/1986 | Drye et al. | 357/81 |
| 4,746,960 | 5/1988 | Valeri et al. | 257/260 |
| 4,827,328 | 5/1989 | Ozawa et al. | 357/80 |
| 4,860,166 | 8/1989 | Nicholls | 361/414 |
| 4,866,508 | 9/1989 | Eichelberger et al. | 156/630 |
| 4,878,991 | 11/1989 | Eichelberger et al. | 156/630 |
| 4,884,122 | 11/1989 | Eichelberger et al. | 257/48 |
| 4,894,115 | 1/1990 | Eichelberger et al. | 134/1.1 |
| 4,907,062 | 3/1990 | Fukushima | 375/75 |
| 4,933,042 | 6/1990 | Eichelberger et al. | 156/239 |
| 5,049,980 | 9/1991 | Saito et al. | 357/80 |
| 5,091,769 | 2/1992 | Eichelberger | 357/72 |
| 5,111,278 | 5/1992 | Eichelberger | 357/75 |
| 5,144,747 | 9/1992 | Eichelberger | 29/839 |
| 5,250,843 | 10/1993 | Eichelberger | 257/692 |
| 5,324,687 | 6/1994 | Wojnarowski | 438/107 |
| 5,426,566 | 6/1995 | Beilstien, Jr. et al. | 361/735 |
| 5,757,072 | 5/1998 | Gorowitz et al. | 257/700 |

FOREIGN PATENT DOCUMENTS 62-122258 6/1987 Japan.

OTHER PUBLICATIONS

Fillion et al., "CAD/CIM Requirements in Support of Plastic Encapsulated MCM Technology for High Volume, Low Cost Electronics," Advancing Microelectronics, pp. 8–14, Sep./Oct. 1994.

*Primary Examiner*—Charles Bowers
*Assistant Examiner*—Brook Kebede
*Attorney, Agent, or Firm*—Heslin & Rothenberg, P.C.

[57] ABSTRACT

Multichip and single chip modules are presented as well as a chips first fabrication of such modules. The multichip module comprises a plurality of chips affixed in a planar array by a structural material which surrounds the sides of the chips such that the upper surfaces of the chips and an upper surface of the structural material are co-planar and the lower surface of at least one chip and a lower surface of the structural material are co-planar. A photo-patternable dielectric is disposed directly on the upper surfaces of the chips. The photo-patternable dielectric includes vias to at least some contact pads at the upper surfaces of the chips and the module further comprises an intrachip metallization layer on the photo-patternable dielectric layer. Subsequent processing provides a multi-layer chip interconnect structure over the intrachip metallization layer and photo-patternable dielectric. Testing and repair of the module can be accomplished prior to or subsequent to fabrication of the multilayer chip interconnect. Formation of multiple single chip modules is accomplished by singulating the multichip module into individual packages.

31 Claims, 11 Drawing Sheets

SINGLE CHIP MODULES, REPAIRABLE MULTICHIP MODULES, AND METHODS OF FABRICATION THEREOF

This Appln is a Division of Ser. No. 08/650,628 May 20, 1996.

TECHNICAL FIELD

The present invention is generally related to multichip and single chip modules, and in particular, to the broad category of chips first fabrication of extremely thin multichip and single chip modules, as well as to repairable multichip modules.

BACKGROUND ART

The conventional approach to electronic packaging and interconnect has been to package individual integrated circuit (IC) chips in a single package and to attach these packages to a printed circuit board to provide interconnect between the individual IC chips. In recent years, this approach has met with problems of speed, size, and interconnect density due to ever constant demands for reduced size and increased performance from such integrated circuit packages.

Process speed is limited by the fact that individual packages have loading capacitance and inductance associated with their relatively long pins and by the large size of conductor runs in the packages relative to the size of the conductors of a bare IC chip. As the speed of computers and other devices continues to increase, the problem of providing electronic packaging and interconnect which provides maximum performance has become a significant challenge.

Size constraints are particularly prevalent in applications such as portable computers and other handheld electronic devices such as pagers and cellular phones. In these applications, more functionality is continually desired, but the form factor is limited. Thus, the general trend is towards overall decreased weight and size with ever increasing functionality. The problem is to produce electronic packaging and interconnect, which provides such high functionality, but requires minimum space.

Interconnect density is also increasing. As computer manufacturers attempt to increase performance, there is a trend towards wider data and address busses. This allows more data to be communicated in a given clock cycle. As a result, the number of pins on a computer chip is steadily growing. Conventional single chip packaging is being stretched to accommodate the growth in pin count and printed circuit boards are resorting to more layers and finer trace widths to provide interconnect between packages. The problem is that this is raising the cost and complexity of the individual packages, the printed circuit boards which provide the interconnect, and the methods of interconnection from the packages to the printed circuit boards.

One solution to many of the above problems is the MultiChip Module (MCM). In an MCM, bare (unpackaged) IC chips are interconnected by means of a miniature printed circuit board whose interconnect pitch may match the pitch on the IC chip themselves. There are presently two main classes of MCM. These are the chips last MCM and the chips first MCM. In the chips last MCM, the miniature circuit board is fabricated first and then the bare IC chips are attached and interconnected to the circuit board. The method of interconnect is usually wire bond or solder bump. In the chips first MCM, the chips are placed first relative to each other and a miniature circuit board is then built above the chips. The interconnect is formed to the IC chips as an integral part of the processing of the circuit board.

Structures in accordance with the present invention fall into the category of chips first MCMs. In the interest of brevity, only the relevant chips first art is discussed below and, where generic problems of MCMs are pertinent, they are also discussed.

One of the major problems facing the MCM industry is the problem of assuring that the chips which are used in an MCM are 100 percent good. Presently, chips are tested at the bare chip level only to the extent necessary to assure that the chips will probably be good if packaged. Typical yields experienced in the industry are 80 to 97 percent from receipt of the bare chip to complete test and burn-in of the packaged part. Since the yields are multiplicative, the yield of a finished 10 chip MCM using such bare chips will run from 10 to 74 percent. This is obviously not a sufficient yield for a viable MCM business. Thus, some chip vendors are beginning to supply bare chips in fully tested and even burned-in form. These so called "Known Good Die" are supplied at a cost which runs from 3× the packaged part cost to as low as 1× the packaged part cost. Even at 1× packaged part cost, however, this doesn't present a viable business scenario because much of the contributed value of the MCM vendor is the packaging of the bare IC chip. A desirable objective is thus to provide a method and structure whereby chips can be tested and burned-in economically before being committed to the MCM. The subject invention addresses this object.

A further problem in chip testing exists in that multiple chips must work together for the system to function properly. In order to accommodate this fact individual chips are "guard-banded" so that the worst case of all chips in a system can be combined and still work together. This leads to discarding a percentage of chips which typically would have worked in the system, but under worst case combinations would fail. The subject invention solves this problem as well. An additional issue is to test chips as combined chip sets before final incorporation into an MCM. The subject invention also addresses this issue. Even with very complex testing systems, the interaction of complex chips may not be completely simulated by the tester, thereby resulting in undesirable surprises when chips are combined in a system.

Repair of finished MCMs is another major issue which faces the MCM industry. In the chips last approach, the methods of repair differ based upon the original method of interconnect of the chip to the circuit board. In the case of wire bonding, all the wire bonds are broken and the bad chip is removed. A new chip is then placed at the old site and new wire bonds are formed at previously unused sites. This leads to the requirement that additional bonding sites be provided for all chips, whether these sites are ultimately used or not. In addition, there is a significant risk of damage to the circuit board during chip and wire bond removal operations which would necessitate scrapping the entire module. Risk of damage is also a problem with solder bump approaches. With solder bumps, careful burnishing preparation of the solder bump sites must be accomplished to assure that the next chip will make proper connection to the circuit board. In the chips last approach, if the interconnecting circuit board is defective there is no repair procedure possible once the board is populated with chips, necessitating scrapping of the module.

In many low cost approaches no method of repair is provided. This constrains these approaches to those systems where the cost of chips is sufficiently low or the value of the form factor sufficiently high that the penalty of scrapping modules can be withstood. Two significant prior art approaches take this route. The first is the so called "chip on board" approach wherein: the circuit board is formed by conventional laminated printed circuit methods; chips are placed on the board; and then wire bonded to the board and covered with an encapsulant for protection. The second is the so called "Plastic Encapsulated MCM". This approach is a chips first approach wherein chips are encapsulated on one side by plastic encapsulant and the circuit board is built above the chips on the other side. With the plastic encapsulant surrounding the chips there is no way to remove them for repair. This fact is discussed in an article by Fillion and Daum entitled: "CAD/CIM Requirements In Support of Plastic Encapsulated MCM Technology For High Volume Low Cost Electronics," Advancing Microelectronics (September/October 1994). The subject invention is also a chips first technique, but is distinguishable in several ways from the conventional art, one of which is the ability to repair the resultant module.

Two major approaches to chips first are the Advanced Multi-Chip Module (AMCM) approach, and the High Density Interconnect (HDI) approach, along with its offshoots including the Plastic Encapsulated MCM.

A representative cross-section of an AMCM structure, generally denoted 10, is shown in FIG. 1. In the AMCM approach, chips 12 are ground to a precise thickness and accurately placed on a flat substrate 14. Encapsulant 16 is dispensed over the chips 12 and in the area between chips, after which the encapsulant is planarized above the chips. The combination of a controlled chip thickness and accurate planarization of encapsulant above the chips leads to a relatively controlled layer of polymer above the tops of the chips. Via holes are formed in the encapsulant above the pads of the IC chips using an excimer laser. Chip interconnect metallization 18 is sputtered on the surface of encapsulant 16 and in the via holes. The metallization is subsequently built up electrolytically and patterned by photolithographic means. Additional interconnection layers 20 are then built up as required by depositing dielectric, forming via holes, metallizing and patterning.

Several problems exist with structure 10 of FIG. 1. First, the thickness of the chips and of the substrate must be accurately controlled in order to control the thickness of the dielectric above the chips. This is a relatively time consuming and expensive process. Second, the encapsulant surrounds the chips both on the sides and above the chips. The desirable characteristics of the encapsulant above the chips, i.e., as a dielectric, and on the sides of the chips, where used primarily as mechanical support, are conflicting. This necessitates a compromise in properties-where the dielectric properties are not optimum from an electrical view and the mechanical properties are not optimum from a structural view. The subject invention addresses this disadvantage of the AMCM approach by providing a structure wherein the mechanical support portion between chips and dielectric portion above the chips can be wholly different materials.

A representative cross-section of an HDI structure, denoted 30, is shown in FIG. 2. In the HDI approach, instead of thinning chips to a predetermined thickness the substrate 32 is machined with wells 34 of different depths. When the chips 36 are placed in the substrate wells, the tops of the chips are disposed even with the top surface of the substrate. An adhesive is applied to the tops of the chips and a pre-processed layer of polymer film 38 is laminated above the chips 36. Via holes are formed in this overlay layer 38 above the pads 39 of the IC chips 36. Metallization 40 is sputtered on the surface of the overlay layer 38 and in the via holes. The metallization is subsequently built up electrolytically and patterned by photolithographic means. Additional interconnection layers 42 are built up as required by depositing dielectric using coating or laminating means, forming via holes, then metallizing and patterning.

One advantage of structure 30 over the AMCM structure 10 of FIG. 1 is that the thickness of the first layer is only dependent on the thickness of the adhesive and the preformed polymer layer 38. It does not require maintaining tight tolerances on the thickness of the chips or flatness of the substrate. Several problems, however, exist with structure 30. First, machining the substrate to fine tolerances is time consuming and expensive. Second, the overlay layer is unsupported in the well space between chips. Where unsupported, the overlay layer sags and makes lithography difficult. Also, because the chips are in wells, there is no support for pads of an input/output (I/O) layer in the area between chips sharing a common well. These drawbacks can be accommodated somewhat by the use of individual wells for chips, but this is at the expense of increasing package size. The subject invention is a chips first approach that avoids the above-outlined disadvantages of the HDI approach.

In an effort to make a lower cost system, a "Plastic Encapsulated MCM" structure 50, such as depicted in FIG. 3, has been proposed. In this approach, which comprises a variation on the basic HDI approach, the machined substrate is replaced by a plastic encapsulation 52. The basic structure 50 is fabricated by a different set of steps than the HDI approach. Specifically, during fabrication the chips 54 are placed down onto an adhesively coated polymer film that is held to a flat platen. The plastic encapsulation 52 is then formed about the chips. As shown, this plastic encapsulation forms the substrate that protects and supports the chips. Thereafter the structure is removed from the platen and the conventional HDI interconnect structure 56 is formed. Again, a first layer applied above the chips comprises a pre-processed film 58 which is adhesively cured to the IC chips. Unfortunately, there are several identifiable problems with the resultant structure.

First, the structure cannot be repaired, which can be a significant consideration in many applications. In addition, the structure is not inherently thermally efficient because plastic encapsulant is a poor thermal conductor. To combat this, the incorporation of thermal "slugs" beneath chips has been proposed. This, however, adds to process cost and complexity. Further, in applications where space is at a premium the plastic encapsulant adds an undesired thickness to the structure. The subject invention overcomes these drawbacks with a simple structure which maintains the advantages of both the HDI and the AMCM approaches.

Another object achieved by the methods of the subject invention relates to the formation of all layers using photo-imageable polymers. It is desirable to use photo-imageable polymers for the dielectric layers because via holes can be formed therein by simple lithography rather than the more complex methods of laser ablation or plasma etching. In the HDI approach, a preformed film is adhesively bonded over the tops of the chips. In the Plastic Encapsulated MCM technique, the chips are first placed face down on an adhesive coated, preformed film which is attached to a platen. The encapsulant is dispensed and cured, and the structure is removed from the platen for subsequent processing. In both cases the result is the same: there is a preformed film adhesively bonded to the IC chips. The only method of forming vias in a preformed film employs etching means such as laser ablation or plasma etching, either of which may cost three times the process cost associated with photo-patterning. Note that present technology does not provide for a preformed film which could be adhesively bonded to IC chips and which is photo-patternable. Essentially, photo-patternable films must be formed in situ above the integrated circuit chips.

In the AMCM approach, a structural dielectric is employed between and above the integrated circuit chips as shown in FIG. 1. The requirement of a structural dielectric to surround the chips negates the use of a photo-patternable dielectric since photo-imageable dielectrics are solvent born. More particularly, once the photo-patternable material is in place between the chips, it would be difficult to remove the solvent and, even if possible, a high degree of shrinkage would accompany the process such that the resultant structure would in all likelihood be non-planar. Further, it would be difficult to employ a photo-patternable dielectric in the thickness required to implement an AMCM. Finally, with an AMCM structure, it is desirable to cure the encapsulant fully and planarize before forming the interconnect wiring above the encapsulant but if a photo-dielectric is fully cured, then the material is no longer photo-patternable.

The following example is provided for appreciating the higher cost and process complexity required to form via openings in the encapsulant of the AMCM approach. This process comprises sputtering a mask of copper above the encapsulant, applying photoresist to the mask, exposing and developing the photoresist, etching the mask using the photoresist pattern, stripping the photoresist, building the mask electrolytically by electroplating, laser scanning to ablate polymer exposed by the mask, and then removing the mask. Actual costs associated with this approach may be three times or more the costs associated with using a photo-patternable material. Further, processing time required to complete the above-outlined via formation may be on the order of seven hours, while a photo-dielectric material can be applied, exposed and developed in approximately one hour of processing time.

For all of the above reasons, present technology does not allow for the use of a photo-patternable dielectric as the first level dielectric with either the AMCM approach or the HDI approach, including the offshoots thereof.

The preformed film of the HDI approach presents another disadvantage in structures where a portion of the chip is very sensitive to being coated with a dielectric, such as coils on high frequency RF devices. The only way to remove the dielectric from the sensitive area is by aggressive means, such as laser ablation or other etching means which tend to damage the sensitive chip area. Photo-imageable materials, on the other hand, can be removed with a non-aggressive development step, thus leaving sensitive areas intact.

While the subject invention is applicable to multichip modules, it is also applicable to fabrication of low cost, high performance single chip packaging. The basic problem in single chip packaging is to provide connection from the pads of the chip to the pads of the circuit board in the most cost effective and reliable manner while still providing the electrical and thermal performance necessary. With existing single chip structures, chip pads are connected by solder balls to small circuit boards which contain solder bumps on the opposite side. This process has two drawbacks; first it requires the use of chips which have solder balls and second it often requires the use of an underfill polymer to take up the expansion difference between the circuit board and the chip. Without the underfill, the solder balls are stressed beyond their elastic limit and fail prematurely during thermal cycling. In a second "chip scale" packaging approach, a wafer is covered with a relatively thick "buffer" layer of polymer, vias are formed and patterned metal makes contact to the chip pads. Solder bumps are then formed on top of the chips. In this structure the solder bump array is necessarily restricted to the size of the chip. If, for example, the chip undergoes a design rule shrink, the package must change accordingly. The subject invention avoids this drawback of the prior art.

DISCLOSURE OF INVENTION

In view of the above discussion, a main object of the invention is to provide an electronic packaging and interconnect means which can be used to provide cost effective packing and interconnect for single IC chips, and for multiple IC chips and related components.

Another object of the invention is to provide an electronic packaging and interconnect means wherein the IC chips can be tested and burned-in in final configuration, and where defective IC chips can be identified and replaced before substantial processing investment accrues.

Another object of the invention is to provide an electronic packaging and interconnect means where both defective chips and defective interconnect can be replaced in finished modules, and where reprocessing can occur on a carrier which carries multiple modules through the process.

A further object of the invention is to provide a chips first electronic packaging and interconnect means where tight control of the thickness of the chips and/or flatness of the substrate is unnecessary, while still retaining tight control of the thickness of the first dielectric layer.

Another object of the invention is to provide a chips first electronic packaging and interconnect means where the dielectric directly above the chips comprises an in situ processed material which is preferably a photo-patternable dielectric.

Yet another object of the invention is to provide a chips first electronic packaging and interconnect means where the dielectric above the chips can comprise a material different from the structural material which surrounds and physically interconnects the chips.

Still another object of the invention is to provide an electronic packaging and interconnect structure having minimum thickness to address space constrained applications.

A still further object of the invention is to provide an electronic packaging and interconnect structure which has no substrate and which can be attached to a low cost heat sink or other unfinished substrate.

Still another object of the invention is to provide an electronic packaging and interconnect structure wherein a planar main surface of each integrated circuit chip is exposed at a main surface of the resultant packaging.

Yet another object of the invention is to provide an electronic packaging and interconnect structure which can accommodate back surface interconnect configurations and interconnection vias from the front surface to the back surface of the package.

Another object of the invention is to provide an electronic packaging and interconnect structure where direct connection to the chips can be achieved without preprocessing of the chips, including application of solder bumps, thinning of the chips, or addition of special polymers and metallization layers.

Still another object of the invention is to provide an electronic packaging and interconnect structure which is inherently capable of high power dissipation.

Briefly summarized, the invention comprises in a first aspect a multichip module that includes a plurality of chips, each comprising an unpackaged chip having at least one side surface, an upper surface, a lower surface, and at least one contact pad at the upper surface. A structural material surrounds the at least one side surface of each chip and mechanically interconnects in spaced planar relationship the plurality of chips. The structural material has an upper surface co-planar with the upper surfaces of the plurality of chips thereby forming a front surface, and a lower surface substantially parallel with the lower surfaces of the plurality of chips, thereby forming a back surface. An in situ processed layer is disposed on the front surface. The in situ processed layer comprises a dielectric material that is different from the structural material which mechanically interconnects the plurality of chips.

This in situ processed layer includes via openings to at least some contact pads at the upper surfaces of the plurality of chips for electrical connection to those contact pads. Preferably, the in situ processed layer comprises a photo-patternable dielectric, and a metallization layer is disposed directly on the photo-patternable dielectric. The metallization layer includes metallization within each via opening electrically connecting to the corresponding exposed contact pad. As an extrapolation, an integrated circuit chip module is also depicted and claimed herein. This single chip module is similar to the multichip module summarized herein except the packaging is directed to a single chip.

A method for fabricating a multichip module is also presented. The method includes the steps of: providing a plurality of chips, each chip comprising a bare chip having at least one side, an upper surface, a lower surface, and a contact pad at the upper surface; placing the plurality of chips on an alignment carrier in spaced relation with the upper surfaces thereof facing the alignment carrier; surrounding the plurality of chips with a structural material such that the at least one side surface of each chip is covered by the structural material and an exposed surface of the structural material is substantially parallel with the lower surfaces of the plurality of chips, thereby defining a back surface; affixing the back surface to a process carrier, and separating the alignment carrier from the plurality of chips; forming by in situ processing a dielectric layer directly on the upper surfaces of the plurality of chips. Further processing can include patterning and forming vias in the in situ formed dielectric layer, the vias being disposed to expose at least some contact pads at the upper surfaces of the chips for facilitating electrical connection thereto; and forming metallization structures above said in situ processed dielectric so that metallization within said vias electrically connect to at least some contact pads exposed by said vias. Again, the in situ processed dielectric layer preferably comprises a photo-patternable dielectric, and metallization is disposed within the via openings formed within the photo-patternable dielectric.

To restate, an electronic packaging and interconnect structure is disclosed herein within the broad category of chips first modules. The disclosed fabrication method is more cost effective than other chips first approaches, and can be used to fabricate both multichip as well as single chip packages. Further, the resultant structure is amenable to testing and subsequent replacement of a defective chip early in the fabrication process. Finished module repair methods are also disclosed. Several extensions of the basic structure are presented including a module with components on both side surfaces of the structure for space constrained/high performance applications. The fabrication method of the structure allows extremely thin modules to be fabricated, even to the point of flexibility of the resultant structure. Further, no special processing of the chips is required, and photo-patterning of all dielectric layers above the chips is possible. Also, a pad pitch which matches that of a circuit board to which the module is to be connected is possible, even for a single chip module, while still providing a thin module.

BRIEF DESCRIPTION OF DRAWINGS

The subject matter which is regarded as the present invention is particularly pointed out and distinctly claimed in the concluding portion of the specification. The invention, however, both as to organization and methods of practice, together with further objects and advantages thereof, may best be understood by reference to the following detailed description taken in conjunction with the accompanying drawings in which:

BEST MODE FOR CARRYING OUT THE INVENTION

Figure 1:
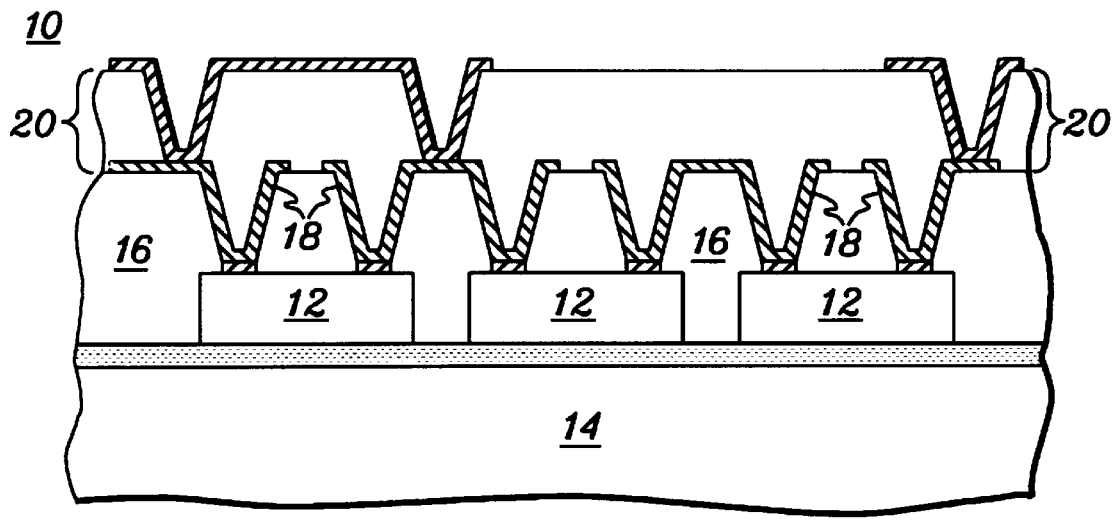
FIG. 1 is cross-sectional elevational view of one embodiment of a conventional advanced multichip module (AMCM)
Figure 2:
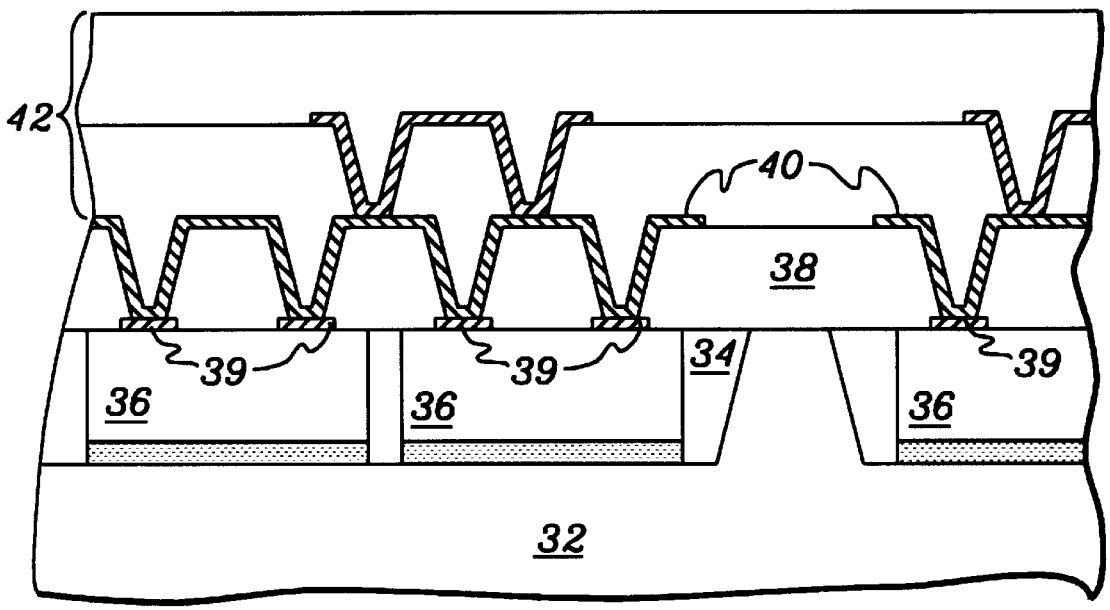
FIG. 2 is a cross-sectional elevational view of one embodiment of a conventional high density interconnect (HDI) multichip module.
Figure 3:
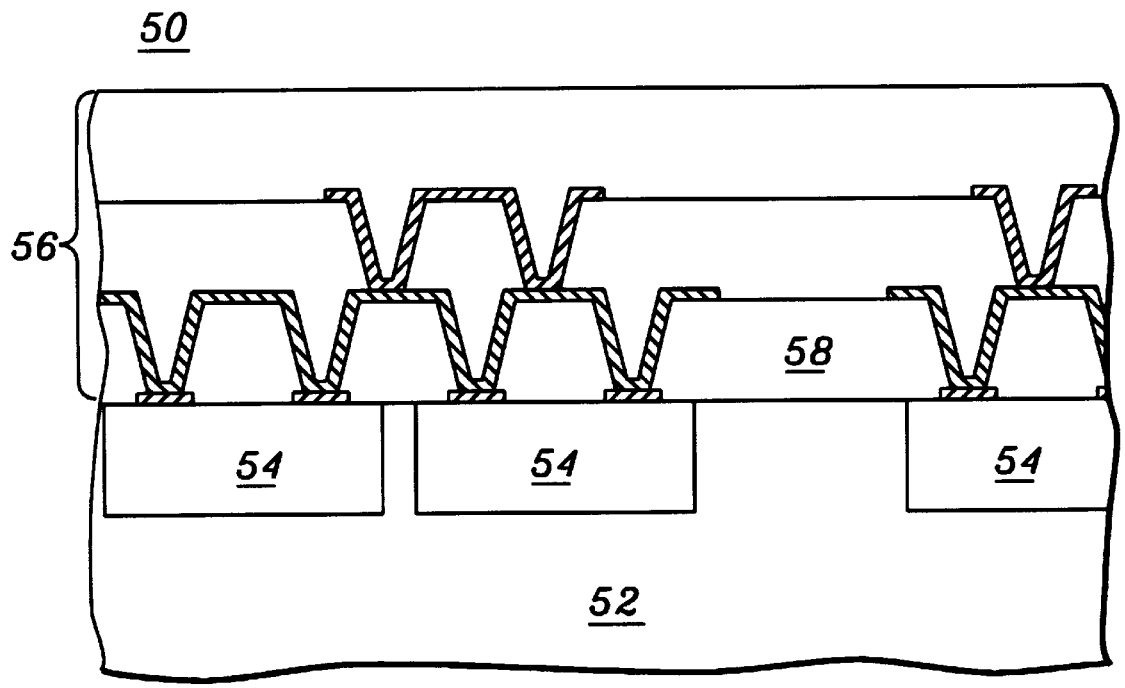
FIG. 3 is a cross-sectional elevational view of one embodiment of a conventional plastic encapsulated HDI multichip module.
Figure 4:
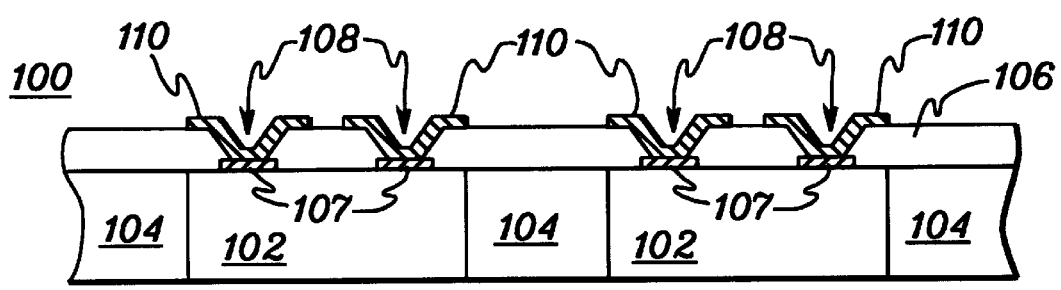
FIG. 4 is a cross-sectional elevational view of one embodiment of a multichip module in accordance with the present invention.

FIG. 4 depicts a basic multichip module, generally denoted 100, pursuant to the present invention. Structure 100 includes multiple bare chips 102 each of which has at least one side surface surrounded by a structural material 104. Preferably, at least one chip of multiple chips 102 comprises an integrated circuit chip. By way of example, other chips might comprise a capacitor chip or resistor chip. An in situ processed layer 106 is disposed physically on the upper surfaces of chips 102 and structural material 104. Via openings 108 are formed in the in situ processed layer 106 to expose at least some of the contact pads 107 at the upper surfaces of the integrated circuit chips. An intrachip metal layer 110 is provided on layer 106 such that metallization within each via opening 108 electrically connects to a corresponding contact pad 107.

Significant features of structure 100 to note include: a structural material 104 which can be different from a first dielectric layer 106 on the upper surfaces of the chips; employing in situ processing to form dielectric layer 106, with layer 106 being preferably photo-patternable; a dielectric layer 106 comprising a homogenous layer physically disposed on the upper surfaces of the chips; the back surface of the module can have no substrate, such that a heat sink could be applied directly to the chips if desired; and finally, the chips may be of different thickness, or more preferably, of uniform thickness upon completion of fabrication of the multichip module.

By way of process overview, multichip module 100 can be fabricated by: adhesively bonding multiple bare chips to an alignment carrier; dispensing and curing the structural material about the chips; lapping the structure to a desired thickness, which may or may not expose the lower surfaces of the bare chips; transferring the structure to a process carrier by affixing the exposed back surface to the process carrier; and removing the alignment carrier. At this point, the upper surfaces of the chips are exposed in the same plane as an upper surface of the structural material. A photo-patternable dielectric can then be coated over the chips and the structural material, vias can be formed in the dielectric and metal (for example) deposited and patterned therein. Subsequent chip interconnect layers can then be conventionally added by alternately applying dielectric and metallization layers. Again, no special processing of the chips is required and photo-patterning of all dielectric layers is possible, including the first level dielectric. FIGS. 5a–5h depict one basic processing approach in accordance with the present invention.

Figure 5A:
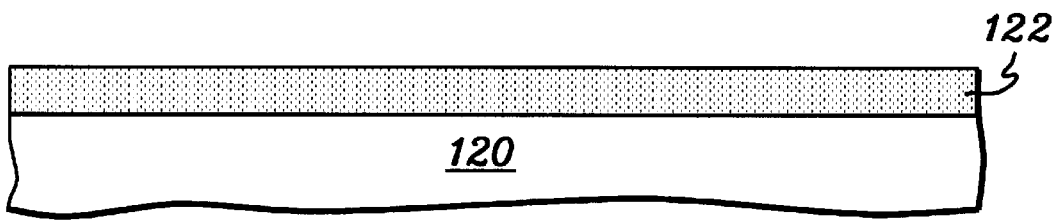
FIGS. 5a–5h are cross-sectional elevational views of process structures attained during manufacturing of a multichip module, such as the module of FIG. 4, in accordance with the present invention.
Figure 5A:
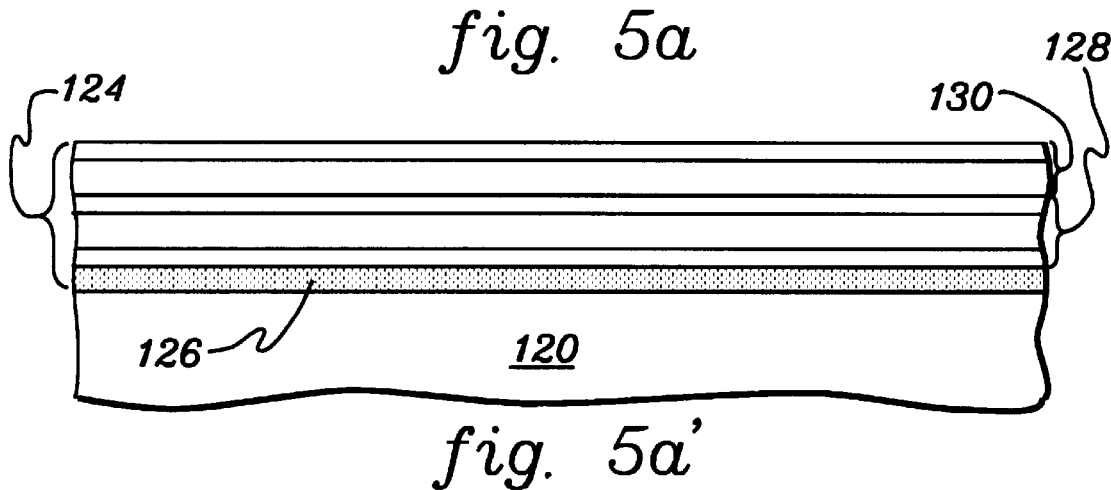

FIG. 5a depicts an alignment carrier 120 coated with an adhesive material 122. A sheet of flat glass has both the flatness and dimensional stability required. The glass is first cleaned to remove any particulate material. A suitable cleaning process is a 5 minute soak in Caros Acid (50/50 Sulfuric Acid and Hydrogen peroxide) followed by rinsing. A suitable adhesive material is hot melt adhesive HM-1 available from ZEON Technologies of Loundonberry, N.H. This material is spun coated to obtain a thickness of approximately 10 microns followed by drying at a temperature of 100° C. for 15 minutes. The alignment carrier is heated until the adhesive is tacky.

An alternate approach to the structure of FIG. 5a is depicted in FIG. 5a'. In this figure, an alignment carrier 120 has an adhesive structure 124 applied to an upper surface thereof. Structure 124 includes a release layer 126 physically contacting the upper surface of alignment carrier 120. This release layer may comprise a hot melt adhesive such as the adhesive ZTX HM-1 available from ZEON Technologies. A double sided tape 128, such as available from Tesa Tape, Inc. of Charlotte, N.C., is applied over release layer 126. Finally, a back grinding film tape 130, for example, type BT-150E-C6 available from Nitto Denko Corporation of Osaki, Japan, is laminated to the exposed surface of the double sided tape 128 so that an upper surface of the back grinding tape 130 presents an adhesive surface. Structure 124 allows the chips to be placed onto the alignment carrier at room temperature. Alternatively, the back grinding tape could be applied directly to the release layer under temperature sufficient to melt the release layer. Finally, the chips (not shown) could be removed from structure 124 by heating the release layer to remove the carrier, and then peeling back the grinding tape 130 with the double sided tape affixed thereto.

Figure 5B:
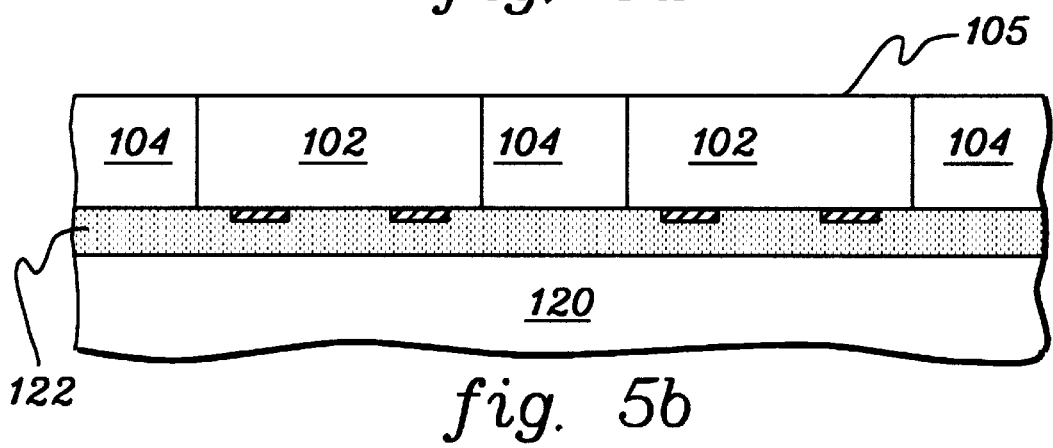

Returning to FIG. 5a, chips 102 are placed accurately face down in adhesive 122 using a high accuracy pick and place machine such as available from MRS1 Micro Robotic Systems, Inc. of Chelmsform, Mass. This process accurately positions the chips in X and Y dimensions, as well as holding the chip faces parallel in the same plane. Next, structural material 104 would be dispensed to fill the spaces between chips 102. A suitable filler material is UVE 1006 available from ZEON Technologies. This material can be cured by UV light using a UV curing system such as available from UV III of Bellingham Mass. Since the chips are not all the same thickness the resultant structure is back lapped, which is a well known process in the semi-conductor industry. Lapping preferably continues until a lower surface of each chip is exposed at a planar back surface 105 of the structure. Alternately, however, lapping could continue until only some, only one, or none of the lower surfaces of the chips are exposed. The thickness is not at all critical to the process. A thickness of 10 mil gives sufficient strength while meeting all but the most severe space constraint requirements. Note that for very space constrained conditions or where flexibility is desired, back lapping can continue to the limits of accuracy of the lapping system employed, which is usually below 1 mil. FIG. 5b depicts the alignment plate with chips and structural material lapped to a desired thickness such that a lower surface of each chip is exposed. By exposing the lower surfaces of the chips, it is possible to subsequently directly thermally couple a heat sink thereto.

Figure 5C:
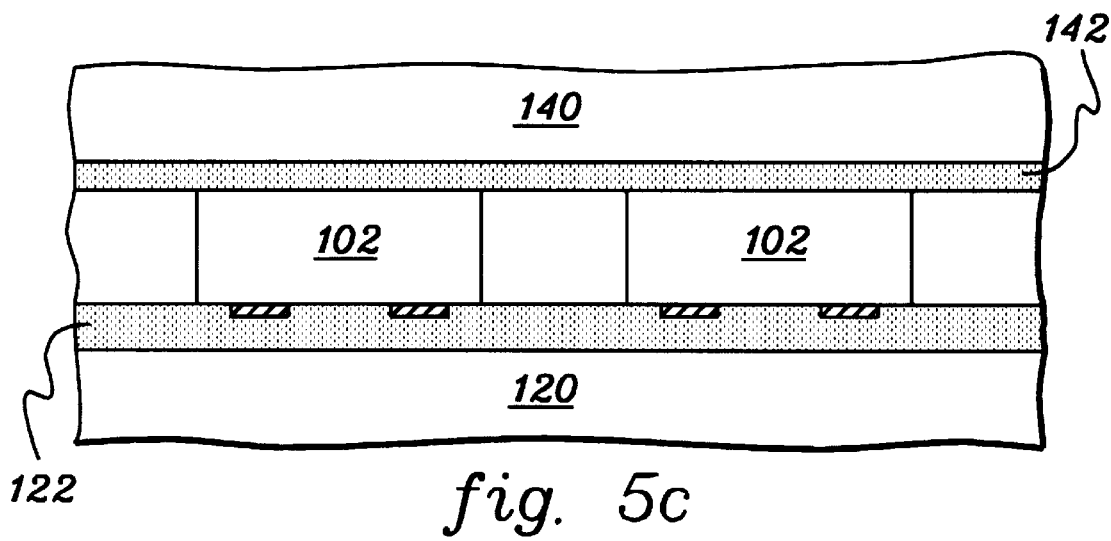
Figure 5D:
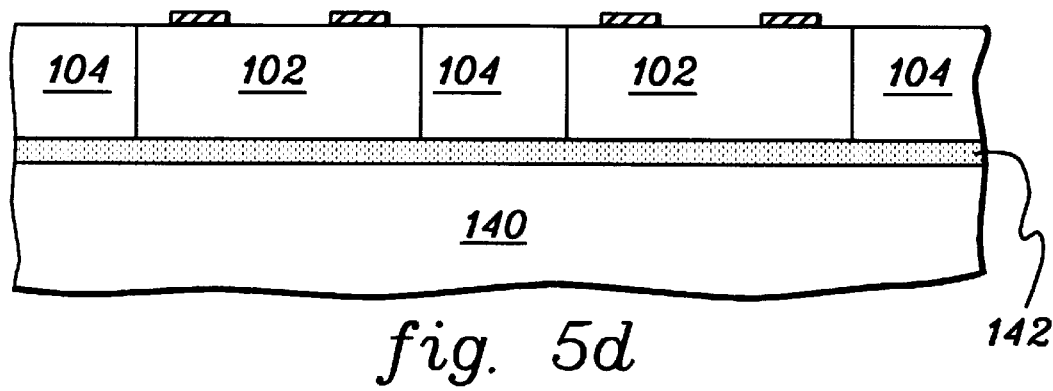

Referring to FIG. 5c, the assembly is next transferred to a process carrier 140. The process carrier is preprocessed with an adhesive and a release layer, together denoted 142. The adhesive holds the assembly through upper surface processing and the release layer facilitates release when processing is complete. Transfer to the process carrier is achieved by placing the alignment plate over the process carrier with the back surface of the chips and structural material in contact with the process carrier adhesive. Preferably, the process carrier is coated with a Cyanoacrylate adhesive, while the lower surfaces of the chips and structural material are coated with the catalyst for the adhesive. Thus, curing of the adhesive is essentially instantaneous with physical contacting of the two surfaces. Once the process carrier adhesive cures, the alignment carrier can be removed by heating the structure to the melting point of the alignment carrier adhesive and lifting the plate away. Any residual adhesive is cleaned away by a suitable solvent. Acetone completely solvents residual ZTX HM-1. FIG. 5d shows the structure adhered to the process carrier 140 with the alignment plate removed and the front surface 103 of the chips and structural material cleaned and free of residual adhesive material. Those skilled in the art should note that a significant advantage of the present invention is inherent in the structure depicted in FIG. 5d, wherein an upper surface of material 104 is co-planar with the upper surfaces of chips 102. This inherent co-planarity facilitates subsequent processing steps above the upper surface of the chips.

In the next step, a photo-patternable dielectric 106 is spray or spin coated over front surface 103. A suitable photo-patternable material is Shipley Photo Dielectric available from Shipley Company, Inc. of Marlborough, Mass. This material is spun coated, for example to a thickness of 24 microns, exposed, developed and post-baked in accordance with the directions supplied by Shipley Company, Inc. Next, metallization 110 is applied. In one embodiment, metal is applied by sputtering. Commercial sputtering equipment such as a Balzers 801, manufactured by Blazers, Inc. of Hudson, N.H., is used to sputter etch the oxide on the aluminum, coat an adhesion layer of titanium to 1000 angstroms and coat a seed copper layer to a thickness of 0.5 micron. Metal patterning is achieved by applying electrodeposited photoresist, such as Shipley Eagle 2100ED to a thickness of 6 microns, exposing and developing a pattern to allow pattern plating. Application, exposure and development conditions are as outlined in the Shipley Company spec. sheets. Copper is pattern plated using an acid copper plating bath at a current density of 20ASF. The resist is then stripped using Shipley product 2009 and the seed copper is stripped in Ammonium persulfate followed by Transene TFT etch of the titanium. At this point the basic structure shown in FIG. 5e has been achieved. Again, it is significant to note that the first layer of dielectric is patterned using a photo-patternable dielectric. This invention is the only known chips first process which allows this. An optional departure in the process flow can be made at this stage by testing the chips either individually or in groups, and thereafter replacing any defective chip. In this way, additional processing can continue with 100 percent good chips. Details of this option are described further below in connection with FIGS. 7a–9e.

Figure 5E:
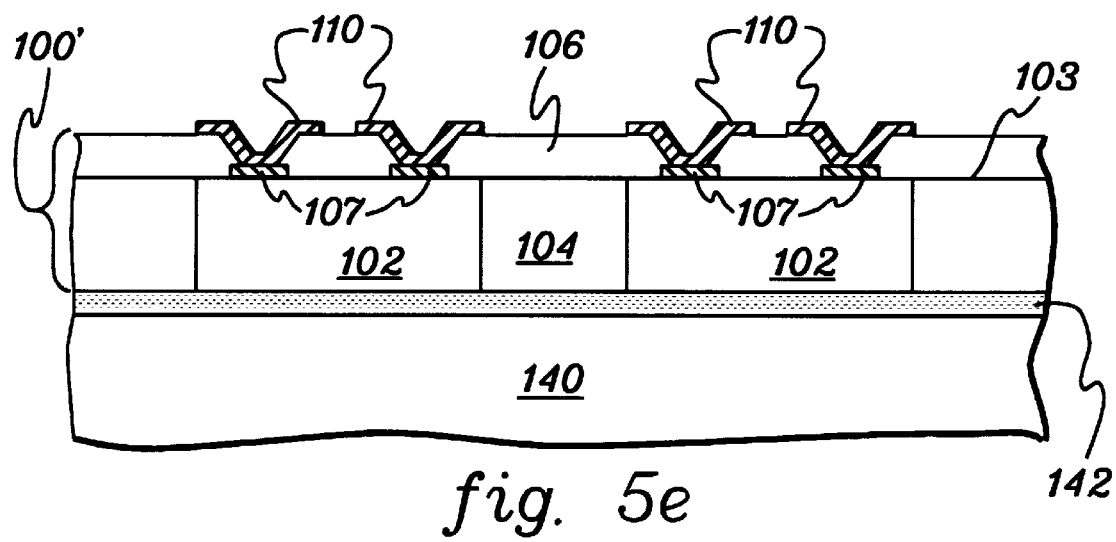
Figure 5F:
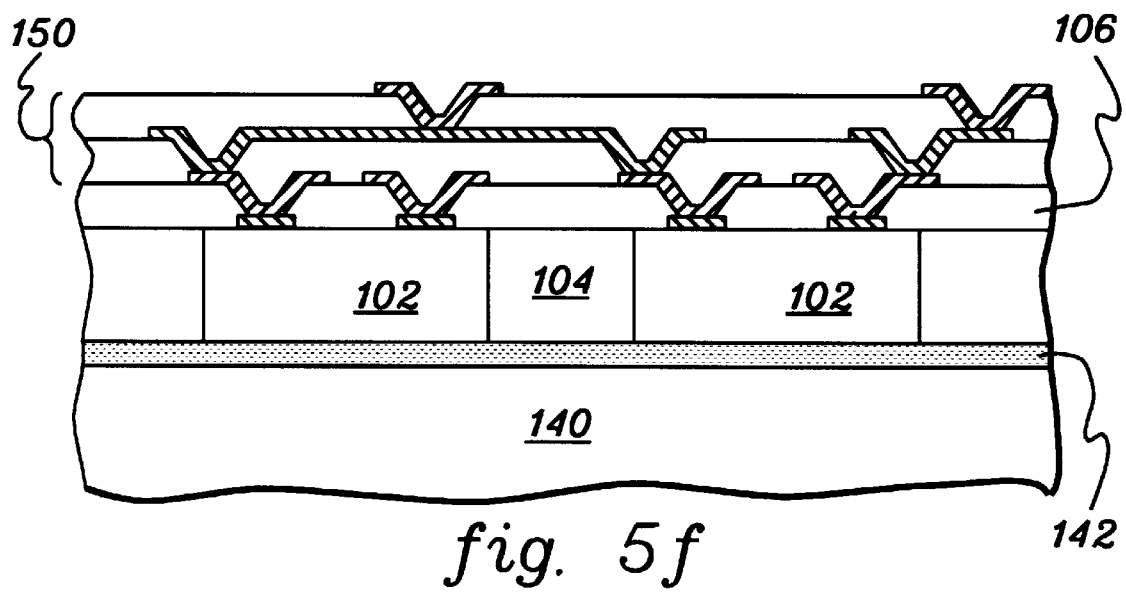
Figure 5G:
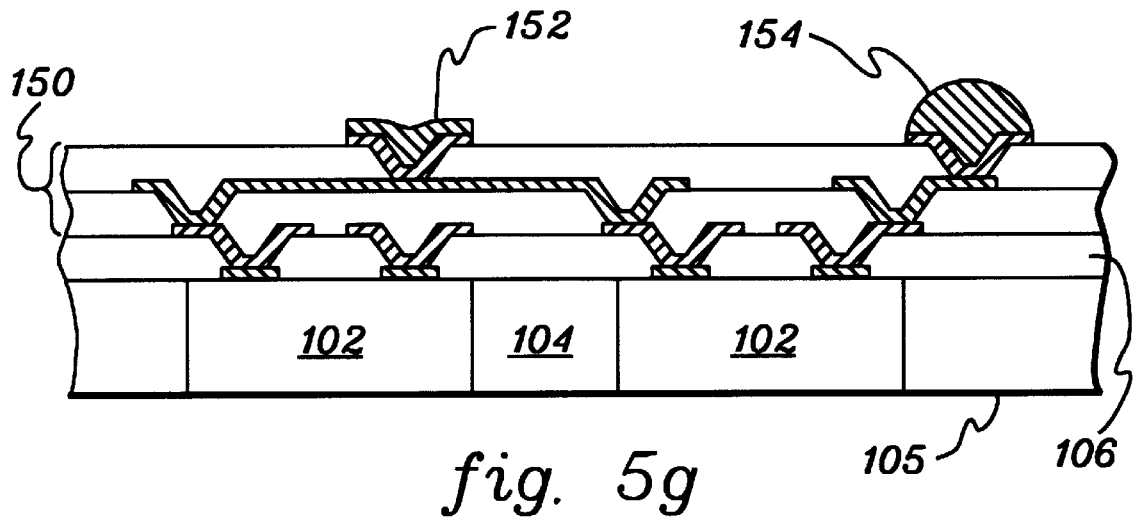
Figure 5H:
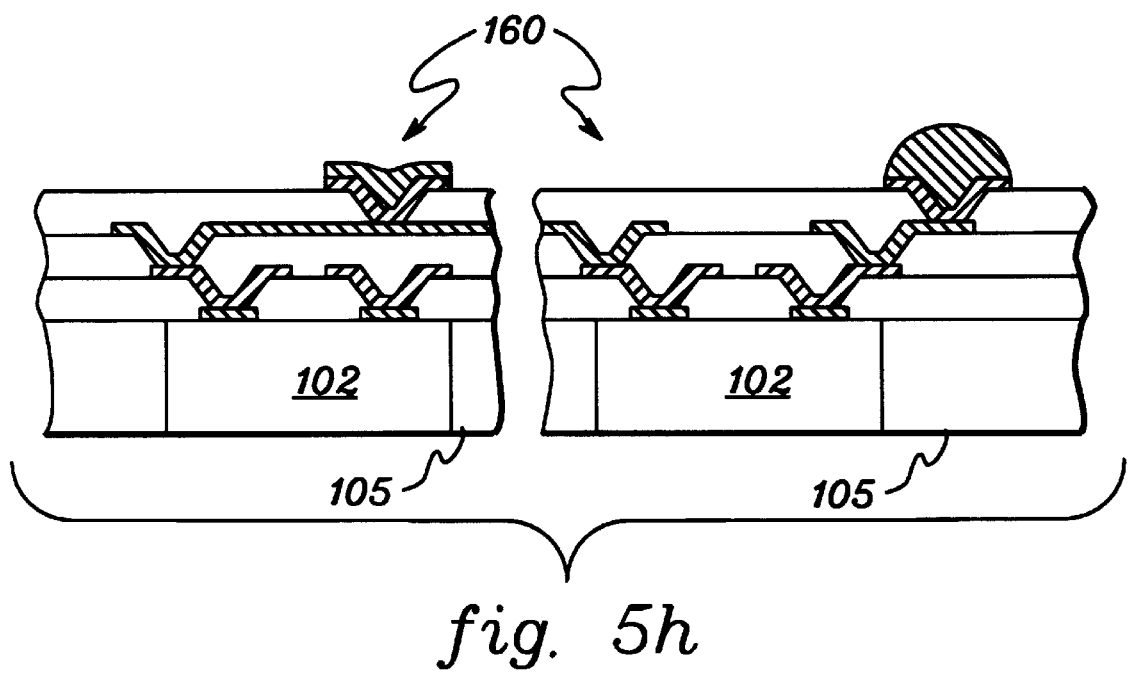

As shown in FIG. 5f, processing continues by coating additional layers of dielectric 144 and patterning additional layers of metallization 146 until the desired interchip interconnect 150 is achieved. Several options for input/output (I/O) structures are enabled by this structure. Two options are shown in FIG. 5g. A gold plated pad grid 152 is achieved by pattern plating the copper to a thickness of approximately 1 mil or more, followed by plating nickel to 100 micro inches and then gold to 50 micro inches. Solder bumps 154 can be achieved by plating the copper to a thickness of 12 microns followed by solder plating of 8 microns. Solder balls or solder paste cones are placed at each site and reflowed to form the desired solder bump 154. Note that the solder bump 154 or pad 152 can be directly above the chip or offset from the chip 102. This increases the usefulness of this technology over other approaches to both single and multiple chip packaging and interconnect. FIG. 5g shows the two layer chip interconnect 150 and intrachip connect structure 106 in one basic embodiment. Alternatively, and as noted above, connect structure 106 could comprise an interchip metal level connect. After removal of the process carrier, a heat sink (not shown) can be attached directly to the back surface 105 of the package, thus providing direct thermal contact to the lower surfaces of the chips. FIG. 5h shows the basic structure singulated to form multiple single chip packages 160. Note that solder bumps or connection pads can be placed directly above or offset to the side of the bare chip, thus allowing any desired I/O pad array configuration to be produced for the single packaged chip.

Basic Structure with Provision for Two Sided Interconnect

Figure 6:
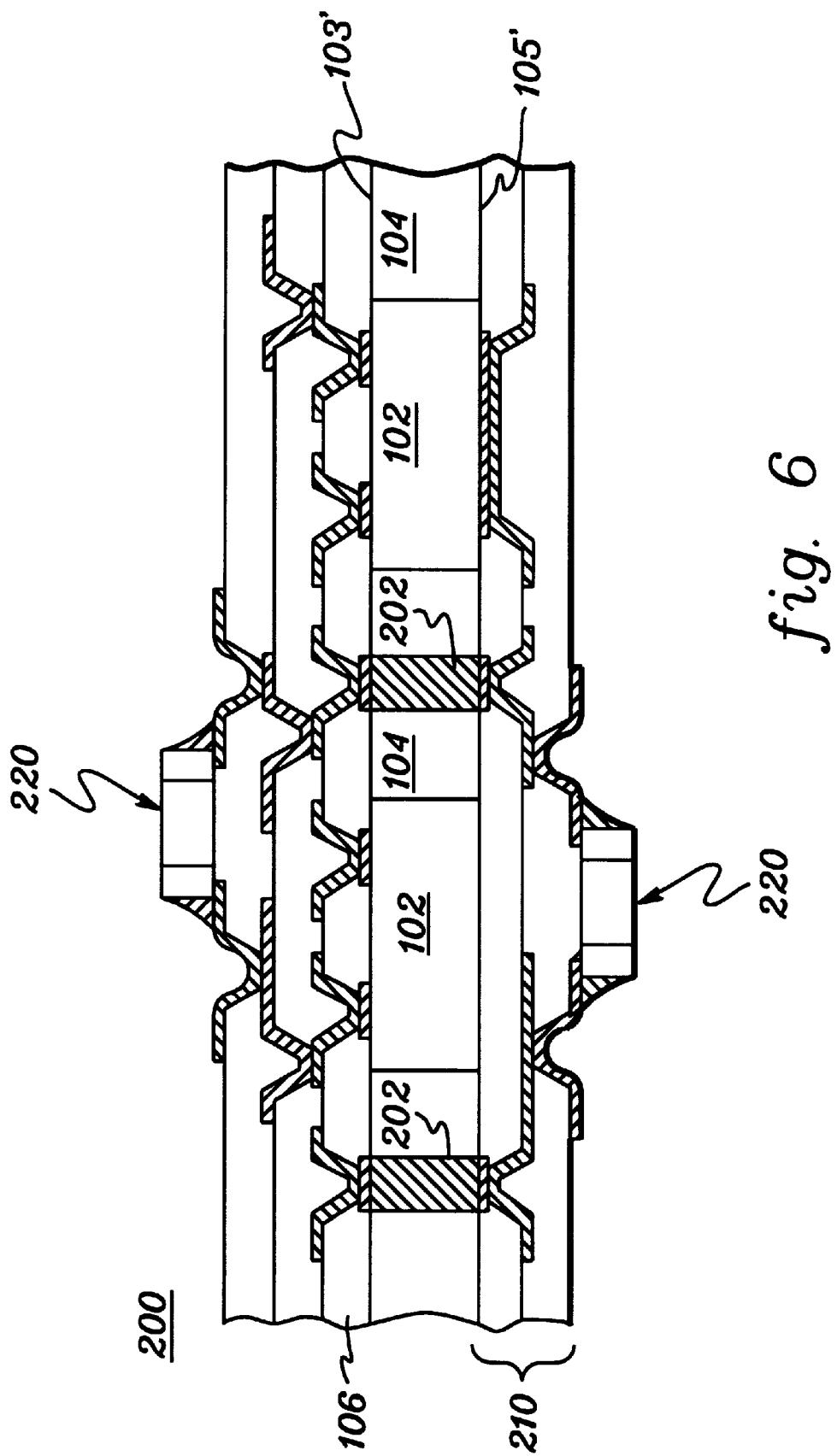
FIG. 6 is a cross-sectional elevational view of one embodiment of a mixed signal application module in accordance with the present invention having front surface and back surface interconnect and a surface mount component at both surfaces.

In high space constrained applications or in applications where it is desirable to have as much chip interconnect as possible close to the active devices, an extension of the basic structure is possible. In this enhanced structure, denoted 200 in FIG. 6, a means is provided for making electrical interconnection from an exposed top side of structure 200 to an exposed back side of the structure. In one embodiment, this means is provided by placing conductive components 202, which may be conductive die or slugs, commensurate with placement of chips 102. Thus, when the assembly is removed from the process carrier, front surface 103' to back surface 105' through connections are embedded in the structural material 104 between the chips. To complete the structure, a circuit board 210 with additional interconnection layers is formed on or preprocessed and secured to back surface 105'. Conductive epoxy or solder can be used to make electrical connection from the preprocessed circuit board both to the embedded through connections 202 and to the lower surfaces of chips 102 as required. Finally, surface mount electronic components 220 can be added on both sides of structure 200 for mixed signals applications. This maximizes the number of components 220 which can be close to any active IC chips, and minimizes the overall volume required for a given interconnect structure.

Details of Test and Chip Replacement

FIG. 5e shows a processing stage where chips 102 are attached to a carrier 140 and the first layer of dielectric 106 and the intrachip metal 110 have been applied and patterned. At this stage, the chips can be conveniently tested either individually or as a functional group. To enhance contact to the chips, a coating of gold can be applied by electroless deposition. A suitable electroless gold is EL221 supplied by Shipley Company, Inc. The gold, which can be coated to a thickness of 10–20 micro inches, serves to improve contact to the test equipment. Contact is made through a Z-axis conductive elastomer to a pad array pattern (not shown) which matches the pad pattern on the module 100' surface. The Z-axis elastomer, such as ECPI, is commercially available from AT&T. Note that during testing, chips 102 are positioned as they will be positioned in the final module. This means that testing can occur by completing the circuit interconnect in a test board in the same way that it will be completed in the final module. Each individual module group can be tested by stepping the test board to each functional group and performing the necessary tests.

Figure 7A:
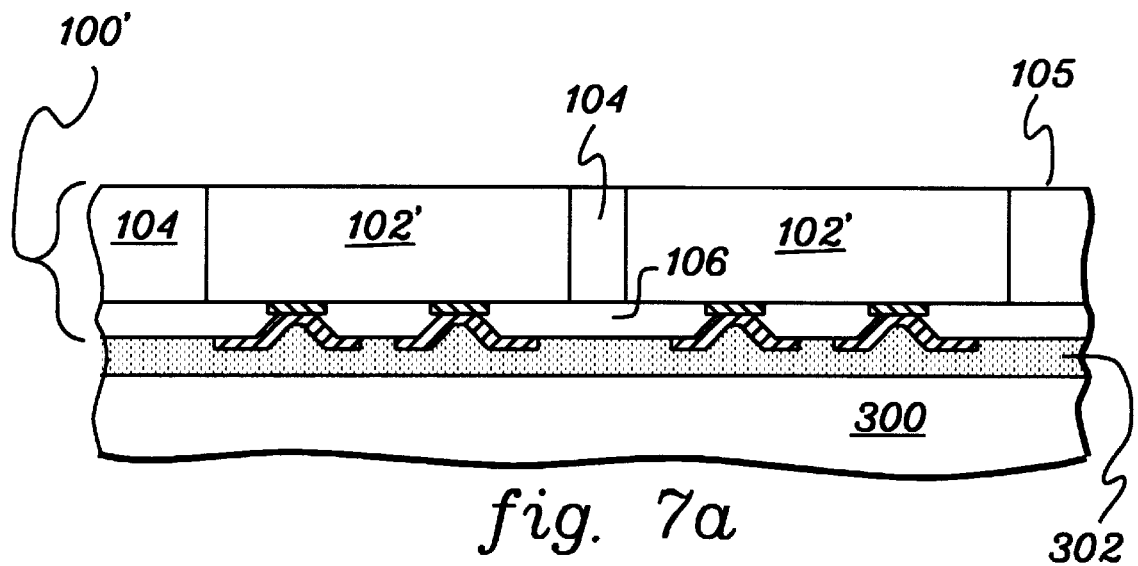
FIGS. 7a–7e are cross-sectional elevational views of one processing embodiment in accordance with the present invention for repairing the multichip module of FIG. 4.

The following process outlines the steps to replace a defective chip identified during a testing process as outlined above. Note that the ability to test chips in final placement but before much interchip interconnect processing has occurred, can significantly improve the cost effectiveness and final yield of the process. FIGS. 7a–7e show one basic process flow embodiment for chip replacement. The first step is to transfer the module from the process carrier 140 (FIG. 5e) to an alignment plate 300 (FIG. 7a). This is done by placing the unfinished module 100' face down on the alignment plate 300 and heating the assembly in a laminating press with light pressure until an alignment plate adhesive 300 melts and forms an adhesive layer 302. The processing carrier is then removed and any residual processing carrier adhesive cleaned from the back surface 105 of the modules.

Figure 7B:
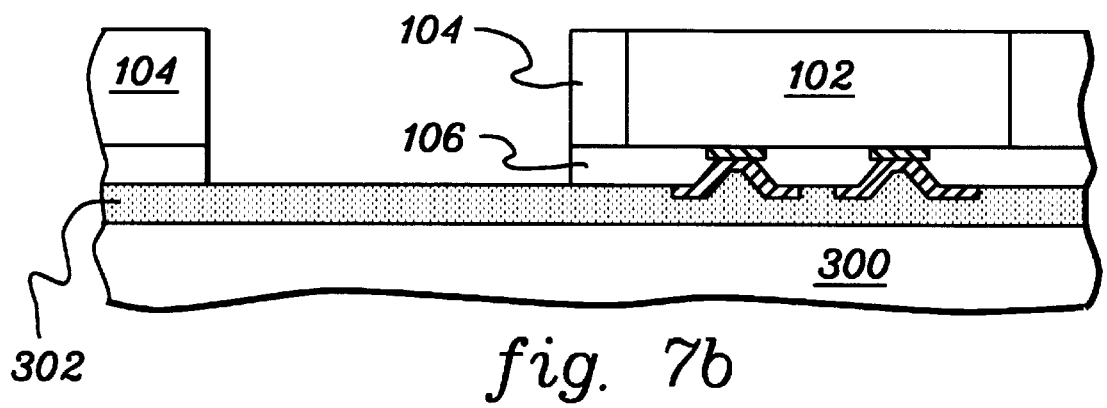

The next step is to remove the defective chip(s) 102'. This can be done by mechanically milling around the chips or by using a laser to score the structural material and first level dielectric around the chip(s). The defective chip 1021 can then be removed with a conventional heated rework tool which heats the chip 102' to the melt point of the adhesive 106 and withdraws chip 102'. The resultant structure with chip 102' removed is shown in FIG. 7b.

Figure 7C:
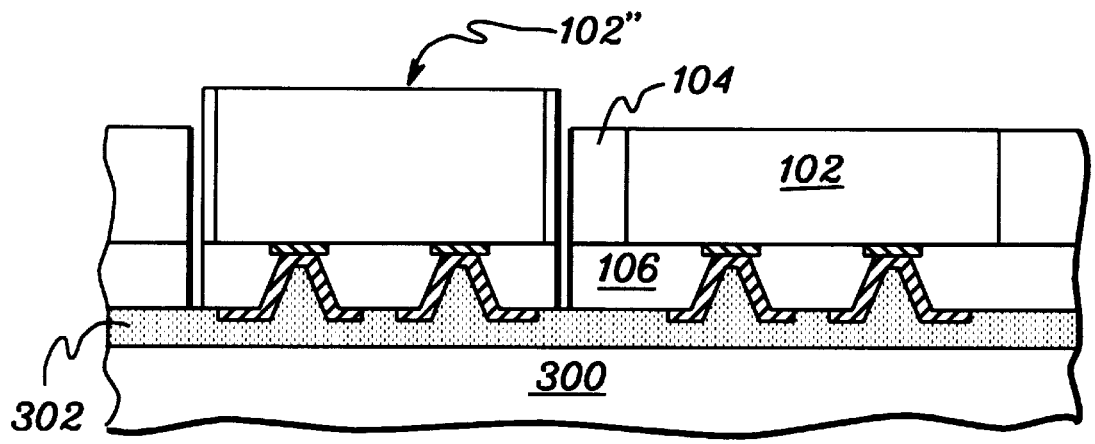
Figure 7D:
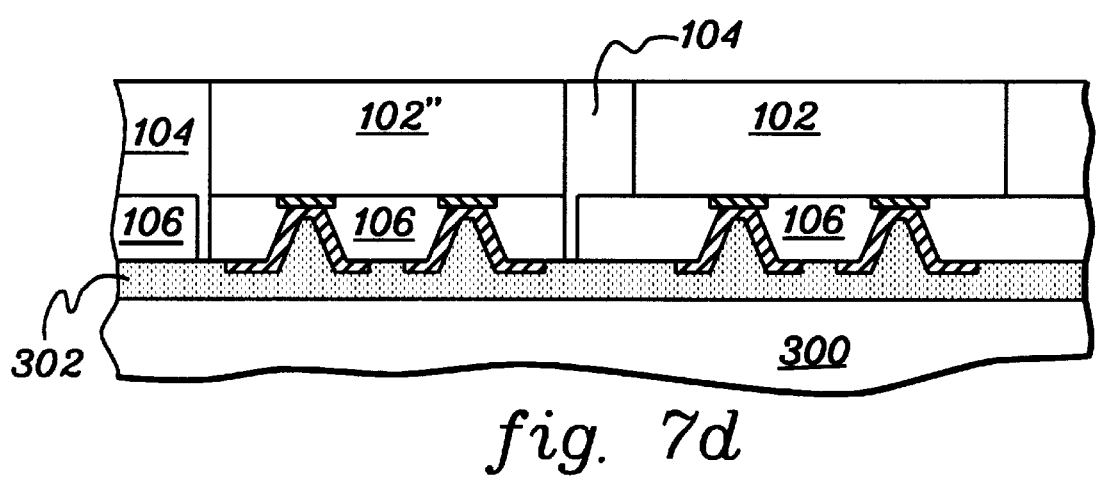
Figure 7E:
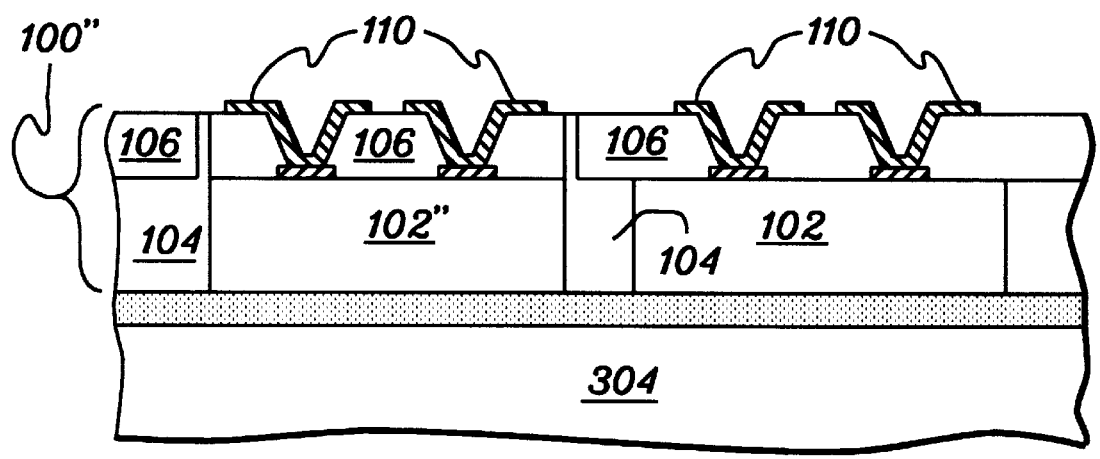

Next, the defective IC chip is replaced with an identical type chip 1021' which has been preprocessed, pretested and packaged. The preprocessed chip can be fabricated using the same process steps as the modules shown in FIG. 5e. Multiple chips of the same type can be generally processed together to create a large supply of extra chips. These chips are then tested and singulated to provide the preprocessed and pretested chips 102". As shown in FIG. 7c, preprocessed chip 102" is accurately placed face down in the adhesive 302 and structural material 104 is added using the same processing steps outlined above. Note that the new chip 102" might deliberately be made slightly thicker than the desired module thickness so that when the circuit is lapped to the desired thickness, essentially the only chip which is thinned is the new chip and the structural filler around this chip. FIG. 7d shows the module at the same point as FIG. 5b. Thus, from this stage processing follows the process outlined above and depicted in FIG. 5b through FIG. 5e. Note that these processing steps can be carried out on chips which have been completely tested even as a group so that final processing yield does not suffer from the fall out of chips from wafer probe to incorporation in a module. The repaired module 100" is depicted in FIG. 7e. Note that the small amount of structural material 104 filling first dielectric layer 106 surrounding new chip 102" is acceptable. This material need not comprise photo-patternable material since the via openings have already been made to the contact pads at the upper surfaces of the chips. In FIG. 7e module 100" has been affixed to a process carrier 304 for the formation of interchip metallization layers above the intrachip metallization 110.

Repair of Finished Modules

Figure 8:
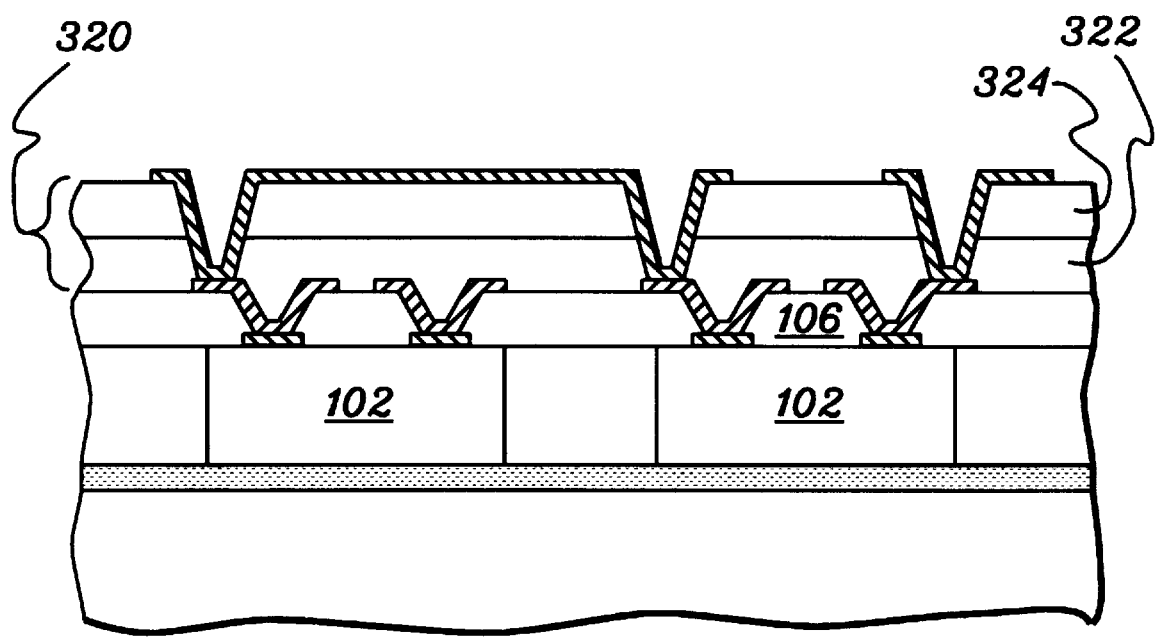
FIG. 8 is a cross-sectional elevational view of one embodiment of an enhanced multichip module, in accordance with the present invention, employing a release layer above the in situ processed dielectric layer.

The repair of a finished module is discussed below in connection with FIGS. 9a–9e. To make repair processing easier, one additional processing step can be incorporated in the basic fabrication method. This step, which is depicted in FIG. 8, would be substituted for or incorporated into the step of FIG. 5f in the basic fabrication method. The objective is to add a "transition" layer 322 in the second dielectric layer physically contacting the first dielectric layer 320. This will subsequently be used to aid in removal of interconnect layers (not shown) above the second dielectric 320. Lapping or grinding techniques can also be used to remove the overlying interconnect. The transition layer is added by spin coating a very thin layer of a thermoplastic such as polysulfone available from Union Carbide. The layer is baked to remove solvent and a second layer of photo-imageable dielectric 324 is spun, baked, exposed, and developed as described above for the first dielectric 106. After a suitable post bake, there will still be polysulfone in the via holes. This can be removed by plasma etching, during which the relatively thick photodielectric acts as a mask. Suitable etching conditions are 4 minutes at 400 watts with a 30 percent Carbontetrafluoride oxygen gas mixture. Metal is then applied and patterned, and subsequent layers are applied as outlined above.

Figure 9A:
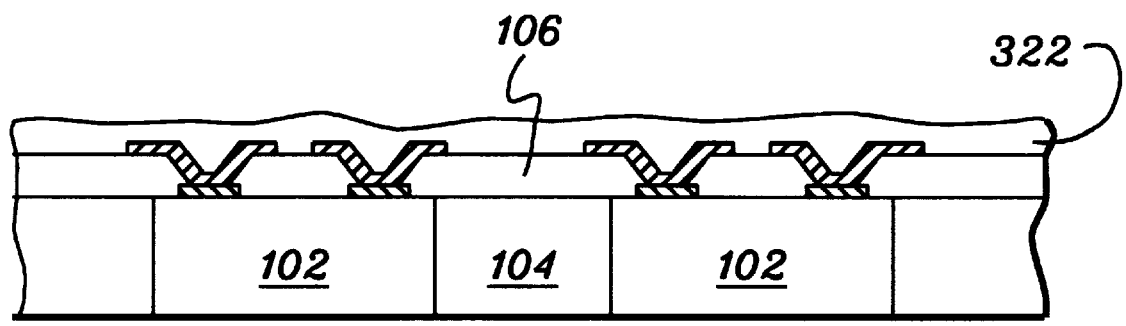
FIGS. 9a–9e are cross-sectional elevational views of one processing embodiment in accordance with the present invention for simultaneously repairing multiple multichip modules.
Figure 9B:
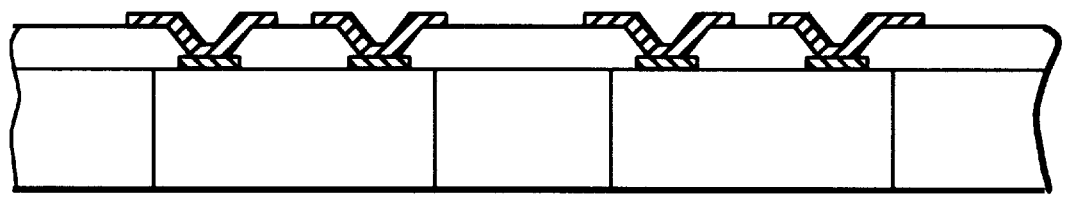
Figure 9C:
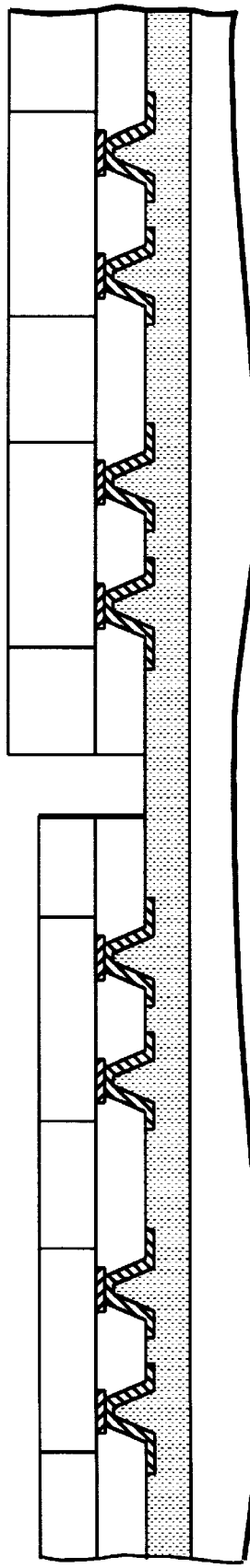
Figure 9D:
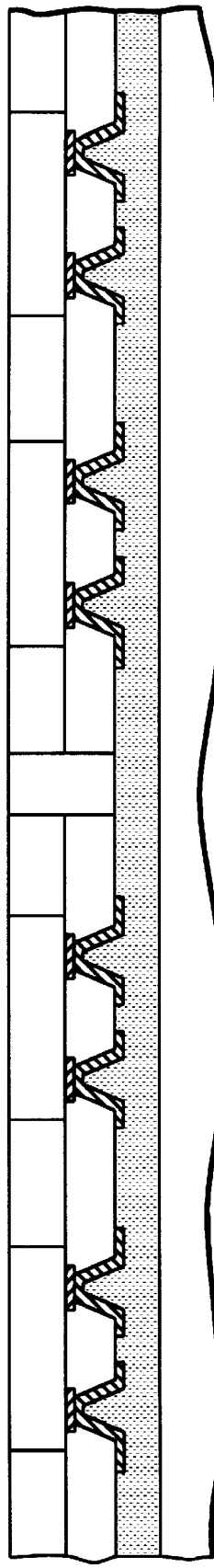
Figure 9E:
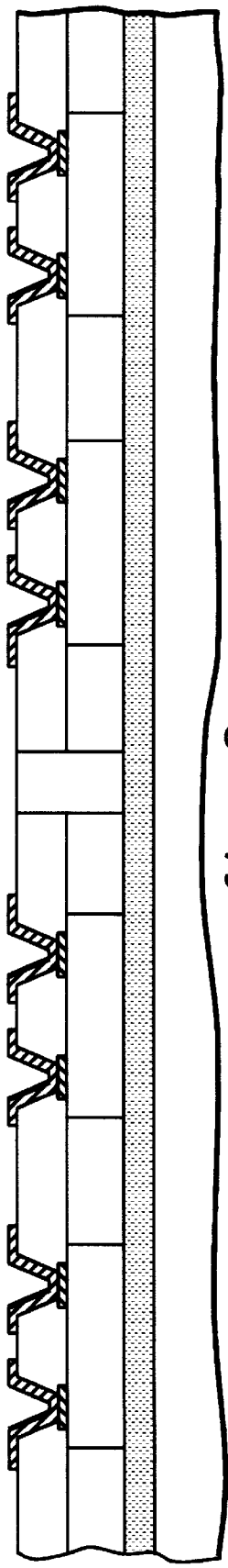

To repair a finished module, the overlying layers of interconnect are first stripped off, resulting in a structure such as shown in FIG. 9a. If the thermoplastic transition layer 322 was used then the overlying layers can be stripped off by heating the structure to the melting point of the thermoplastic and separating the multiple chip interconnect layers from the module. If grinding/lapping is to be used, then the module is ground to remove the overlying layers. The residue can be cleaned by etching any metal, followed by solvent or plasma cleaning of residue of the second dielectric. The cleaned module 100 is shown in FIG. 9b. This module 100 along with others like it is placed face down in an adhesive 402 (FIG. 9c) on an alignment carrier 400 using a precision pick and place mechanism in the same way as chips are placed in the basic fabrication method. Note that it is possible that modules of the same type processed an different carriers may have different thicknesses. This does not pose a problem. Structural filler material 106 is dispensed and cured and the resultant structure is lapped to the desired thickness. It is necessary to lap to the thickness of the thinnest module to get good uniformity. At this point, the module is transferred from the alignment carrier 400 to a processing carrier 410 (FIG. 9e) as described above. All subsequent processing is identical to processing of an original module, including test and replacement of defective IC chips.

Details of Transfer from Process Carrier to Alignment Carrier

Two methods for transfer from the process carrier to the alignment carrier are disclosed. In the first method the process carrier is a quartz plate. The module is bonded to the quartz plate using the cyano acrylate described above or using an UV curable epoxy such as UVE 1004 available from ZEON Technologies. After the module is bonded to the alignment carrier the process carrier can be removed using an excimer laser. The excimer laser energy is aimed at the process carrier adhesive through the quartz plate which is transparent to UV. The process carrier adhesive absorbs the energy and vaporizes, which separates the carrier at the carrier-adhesive boundary. Suitable conditions are 200–500 mJ per cm squared per pulse width. Ten pulses might be required for each area to be removed. Scanning a narrow beam gives the best removal results.

In a second approach, a release layer with a narrow melting point such as lead-tin solder can be used. The module is bonded to the release layer. To release the module, the process carrier is held on a temperature controlled vacuum chuck. The temperature of the process carrier quickly reaches the melt point of the process carrier adhesive and the module is released before the melt point of the alignment carrier adhesive is reached. This process takes advantage of the relatively good thermal conductivity of the process carrier and the relatively poor thermal conductivity of the adhesive and dielectric layers which separate the process carrier and alignment carrier.

Figure 10:
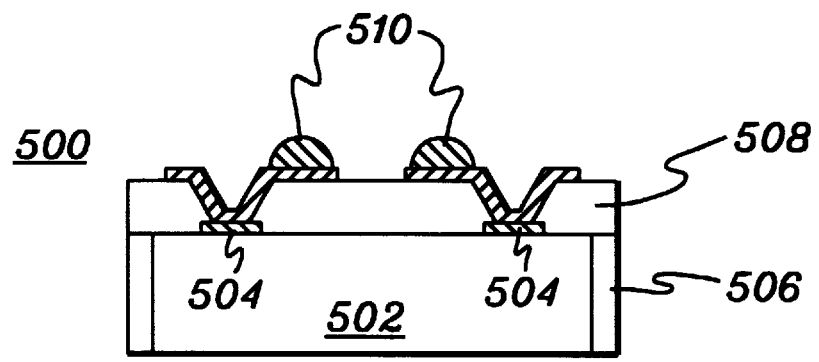
FIG. 10 is a cross-sectional elevational view of one embodiment of a single chip module in accordance with the present invention.

FIG. 10 depicts by way of example a cross-sectional view of one embodiment of a single chip module, denoted 500, in accordance with the present invention. Module 500 includes an integrated circuit chip 502 having multiple contact pads 504 at an upper surface thereof. Chip 502 includes at least one side surface which extends between the upper surface of the bare chip and the lower surface of the chip. The at least one side surface is covered by a structural material 506 which may be the same as that employed above in connection with the multichip modules described herein. Disposed directly above the chip is an in situ processed layer 508, which preferably comprises a photo-patternable dielectric. Vias have been formed within the photo-patternable dielectric to expose contact pads 504. An appropriate metallization layer resides within the vias and includes solder bump contacts 510 for electrically connecting the single chip module 500 to an external structure, such as a printed circuit board. Note from FIG. 10 that no module substrate is required, and structural material 506 can be different from the in situ processed dielectric 508 above the integrated circuit chip. Further, the width of the structural material may be increased as necessary to support a desirable pad configuration above the upper surface of the integrated circuit chip. As with the multichip modules presented above, the first dielectric layer preferably comprises a photo-patternable dielectric material.

To restate, an electronic packaging and interconnect structure is disclosed herein within the broad category of chips first modules. The disclosed fabrication method is more cost effective than other chips first approaches, and can be used to fabricate both multichip as well as single chip packages. Further, the resultant structure is amenable to testing and subsequent replacement of a defective chip early in the fabrication process. Finished module repair methods are also disclosed. Several extensions of the basic structure are presented including a module with components on both side surfaces of the structure for space constrained/high performance applications. The fabrication method of the structure allows extremely thin modules to be fabricated, even to the point of flexibility of the resultant structure. Further, no special processing of the chips is required, and photo-patterning of all dielectric layers above the chips is possible. Also, a pad pitch which matches that of a circuit board to which the module is to be connected is possible, even for a single chip module, while still providing a thin module.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

What is claimed is:

1. A method for fabricating a multichip module comprising:
    (a) providing a plurality of chips, each chip comprising a bare chip having at least one side, an upper surface, a lower surface, and a contact pad at said upper surface;
    (b) placing said plurality of chips on an alignment carrier in spaced relation with the upper surfaces thereof facing said alignment carrier;
    (c) surrounding said plurality of chips with a structural material such that said at least one side of each chip is covered by said structural material, an exposed planar surface of said structural material being substantially parallel with the lower surfaces of said plurality of chips, thereby defining a back surface; and
    (d) affixing said back surface to a process carrier, and separating said alignment carrier from said plurality of chips.

2. The method of claim 1, further comprising forming metallization structures above said plurality of chips to electrically interconnect said chips.

3. The method of claim 1, further comprising forming by in situ processing a dielectric layer on the upper surfaces of said plurality of chips and an upper surface of said structural material substantially co-planar therewith.

4. The method of claim 3, further comprising patterning and forming vias in said in situ formed dielectric layer, said vias being disposed to expose at least some contact pads at the upper surfaces of the plurality of chips for facilitating electrical connection thereto.

5. The method of claim 2, further comprising forming metallization structures above said in situ formed dielectric layer, said metallization structures comprising metallization within said vias electrically connected to at least some contact pads exposed by said vias.

6. The method of claim 5, wherein said forming of said metallization structures comprises forming intrachip metallization within said vias electrically connected to at least some contact pads exposed by said vias, wherein intrachip metallization over each chip is isolated from intrachip metallization over each other chip of said plurality of chips such that said intrachip metallization structures individually fail to electrically interconnect any two chips of said plurality of chips.

7. The method of claim 3, wherein said surrounding step (c) includes surrounding said plurality of chips with the structural material such that the at least one side surface and the lower surface of each chip is covered by the structural material, and removing structural material from the exposed surface of the structural material until said structural material has a thickness equal to at least one chip of said plurality of chips, the exposed surface of said structural material being co-planar with the lower surface of said at least one chip.

8. The method of claim 7, wherein said removing comprises lapping said exposed surface until said structural material has a thickness equal to said thickness of said at least one chip of said plurality of chips.

9. The method of claim 8, wherein said lapping comprises lapping said exposed surface until the lower surfaces of said plurality of chips and said exposed surface of said structural material are co-planar.

10. The method of claim 3, wherein said forming comprises forming a photo-patternable dielectric layer on the upper surfaces of the plurality of chips and the upper surface of the structural material, said photo-patternable dielectric layer comprising said in situ formed dielectric layer.

11. The method of claim 10, wherein the structural material of said surrounding step (c) comprises a polymer consisting of one of epoxy, urethane, and polyimide.

12. The method of claim 9, wherein said surrounding step (c) comprises:
    (i) applying said polymer until said at least one side of each chip is covered by said polymer and said polymer has a thickness at least equal to a thickness of a thickest chip of said plurality of chips;
    (ii) curing said polymer; and
    (iii) lapping said polymer from an exposed surface at least until said exposed surface of said polymer and a lower surface of said thickest chip of said plurality of chips are co-planar, thereby defining said back surface.

13. The method of claim 3, wherein said placing step (b) includes securing said plurality of chips to said alignment carrier via an adhesive layer.

14. The method of claim 13, wherein said affixing step (d) includes providing a process carrier adhesive on said process carrier for affixing said back surface thereto, and applying a catalyst for said process carrier adhesive on said back surface such that said back surface is substantially instantaneously affixed to said process carrier upon physical contact with said process carrier adhesive.

15. The method of claim 3, further comprising providing a first multi-layer structure over said in situ formed dielectric layer, said first multi-layer structure including chip interconnect metallization electrically interconnecting at least some chips of said plurality of chips.

16. The method of claim 15, further comprising applying a release layer to said in situ formed dielectric layer prior to said providing of said first multi-layer structure, said release layer facilitating subsequent removal of said first multi-layer structure.

17. The method of claim 15, further comprising affixing at least one surface mount electronic component to an exposed surface of said first multi-layer structure such that said at least one surface mount electronic component is electrically connected to at least one chip of said plurality of chips.

18. The method of claim 15, further comprising providing a second multi-layer structure disposed over said back surface.

19. The method of claim 18, wherein said providing of said second multi-layer structure comprises providing said second multi-layer structure as a preprocessed printed circuit board and attaching said preprocessed printed circuit board to said back surface.

20. The method of claim 18, wherein said placing step (b) includes placing at least one conductive through connect die commensurate with placing of said plurality of chips such that said structural material of said step (c) surrounds a side of said at least one electrical through connect die, and wherein said at least one electrical through connect die electrically couples said first multi-layer structure and said second multi-layer structure.

21. The method of claim 20, further comprising a first surface mount electronic component affixed to an exposed surface of said first multi-layer structure and a second surface mount electronic component affixed to an exposed surface of said second multi-layer structure, said first surface mount electronic component and said second surface mount electronic component each being electrically coupled to at least one chip of said plurality of chips.

22. The method of claim 3, further comprising testing said plurality of chips for a defective chip and if identified, repairing said multichip module by replacing said defective chip.

23. The method of claim 22, wherein said repairing comprises:
  (i) transferring said multichip module to an alignment plate by affixing said alignment plate to an exposed surface of said in situ formed dielectric layer and temporarily removing said process carrier from said plurality of chips;
  (ii) removing a defective chip of said plurality of chips;
  (iii) replacing the defective chip with a preprocessed chip of a same chip type as the defective chip; and
  (iv) surrounding the preprocessed chip with structural material to physically bond the preprocessed chip to other chips of the plurality of chips in the multichip module.

24. The method of claim 23, wherein said removing of said defective chip comprises mechanically milling or laser ablating said structural material and said in situ formed dielectric layer about said defective chip to facilitate removal of said defective chip.

25. The method of claim 23, wherein said preprocessed chip has a thickness greater than said thickness of said structural material in said step (c) and said repairing further comprises subsequent to said replacing step (iii), lapping a back surface of said preprocessed chip to a thickness equal to said thickness of said structural material surrounding said plurality of chips in said step (c).

26. A method for forming a single chip module comprising employing said multichip module fabricating method of claim 5, and subsequent thereto, separating said plurality of chips in said multichip module such that a single chip module is formed for each chip of said plurality of chips.

27. A method for repairing a multichip module comprising a plurality of chips, each chip comprising an unpackaged chip having at least one side surface, an upper surface, a lower surface, and at least one contact pad at the upper surface, the multichip module further including a structural material surrounding the at least one side surface of each chip of the plurality of chips and mechanically interconnecting in spaced, planar relation the plurality of chips, the structural material having an upper surface substantially co-planar with an upper surface of each chip of the plurality of chips to form a first substantially co-planar surface, the first substantially co-planar surface comprising a front surface, and such that a lower surface of the structural material is essentially parallel with a lower surface of each chip of the plurality of chips to form a second surface, the second surface comprising a back surface, and the multichip module further including an in situ processed layer disposed on the front surface, the in situ processed layer comprising a material different from the structural material mechanically interconnecting the plurality of chips, the in situ processed layer including via openings to at least some contact pads at the upper surfaces of the plurality of chips for facilitating electrical connection thereto, said method comprising:
  (i) transferring said multichip module to an alignment plate by affixing said alignment plate to an exposed surface of said in situ processed layer;
  (ii) removing a defective chip;
  (iii) replacing the defective chip with a preprocessed chip of a same chip type as the defective chip; and
  (iv) surrounding the preprocessed chip with structural material to physically bond the preprocessed chip to other chips of the plurality of chips in the multichip module.

28. The method of claim 27, wherein said removing of said step (ii) chip comprises mechanically milling or laser ablating said structural material and said in situ processed layer about said defective chip to facilitate removing of said defective chip.

29. The method of claim 27, wherein said preprocessed chip has a thickness greater than said thickness of said structural material surrounding said side surfaces of said plurality of chips, and wherein said method further comprises lapping a back surface of said preprocessed chip to a thickness equal to said thickness of said structural material surrounding said at least one side surface of each chip of said plurality of chips.

30. A method for repairing a multichip module comprising a plurality of chips, each chip comprising an unpackaged chip having at least one side surface, an upper surface, a lower surface, and at least one contact pad at the upper surface, the multichip module further including a structural material surrounding the at least one side surface of each chip of the plurality of chips and mechanically interconnecting in spaced, planar relation the plurality of chips, the structural material having an upper surface substantially co-planar with an upper surface of each chip of the plurality of chips to form a first substantially co-planar surface, the first substantially co-planar surface comprising a front surface, and such that a lower surface of the structural material is essentially parallel with a lower surface of each chip of the plurality of chips to form a second surface, the second surface comprising a back surface, and the multichip module further including an in situ processed layer disposed on the front surface, the in situ processed layer comprising a material different from the structural material mechanically interconnecting the plurality of chips, the in situ processed layer including via openings to at least some contact pads at the upper surfaces of the plurality of chips for facilitating electrical connection thereto, and wherein the multichip module further includes a multi-layer structure disposed over the in situ processed layer, the multi-layer structure including a chip interconnect metallization layer electrically interconnecting at least some chips of the plurality of chips, said method comprising:
  (i) removing said multi-layer structure disposed over said in situ processed layer;
  (ii) affixing an exposed surface of said in situ processed layer to an alignment plate;

(iii) removing a defective chip;

(iv) replacing the defective chip with a preprocessed chip of a same chip type as the defective chip; and (v) surrounding the preprocessed chip with structural material to physically bond the preprocessed chip to other chips of the plurality of chips in the multichip module.

31. The method of claim 30, wherein said removing said (iii) comprises mechanically milling or laser ablating said structural material and said in situ processed layer about said defective chip to facilitate said removing of said defective chip.

* * * * *